United States Patent [19]

Grabbe

[11] 4,362,902

[45] Dec. 7, 1982

[54] CERAMIC CHIP CARRIER

[75] Inventor: Dimitry G. Grabbe, Lisbon Falls, Me.

[73] Assignee: AMP Incorporated, Harrisburg, Pa.

[21] Appl. No.: 248,604

[22] Filed: Mar. 27, 1981

[51] Int. Cl.³ .................... H01L 23/48; H05K 5/02
[52] U.S. Cl. ........................... 174/52 FP; 357/70;
        361/421; 29/827
[58] Field of Search ............ 174/52 FP; 357/70;
        29/589, 827; 428/571, 572; 361/421

[56] References Cited

U.S. PATENT DOCUMENTS

| | | | |
|---|---|---|---|
| 3,529,073 | 9/1970 | Leonard | 174/52 FP |
| 3,611,061 | 10/1971 | Segerson | 317/234 R |
| 3,676,748 | 7/1972 | Kobayashi et al. | 357/70 X |
| 3,711,625 | 1/1973 | Dupuis | 174/52 PE |
| 4,048,438 | 9/1977 | Zimmerman | 174/68.5 |
| 4,049,903 | 9/1977 | Kobler | 174/68.5 |
| 4,089,733 | 5/1978 | Zimmerman | 156/630 |
| 4,137,546 | 1/1979 | Frusco | 357/70 |
| 4,141,712 | 2/1979 | Rogers | 65/36 |
| 4,204,317 | 5/1980 | Winn | 29/827 |
| 4,289,922 | 9/1981 | Devlin | 357/70 X |

Primary Examiner—A. T. Grimley
Assistant Examiner—D. A. Tone

[57] ABSTRACT

A semiconductor chip carrier having a lead frame wherein the ends of each of the inner lead portions, which are closely adjacent to the semiconductor device to which the leads are to be bonded, are manufactured with the inner leads temporarily connected to a common supporting rim which must be removed after the attachment of the lead frame to the ceramic substrate is completed. This provides accurate and constant spacing between the leads of the lead frame during the bonding of the lead frame to the ceramic substrate. The rim is removed from the lead frame after bonding of the lead frame to the ceramic substrate. This is accomplished by reducing the thickness of the rim and a portion of the leads of the lead frame contacting and closely adjacent to the rim. This provides a space between the rim and the substrate during the bonding of the lead frame to the substrate. In this way, the rim and a small portion of the leads do not bond to the substrate, thereby allowing the rim to be later removed quite easily.

4 Claims, 4 Drawing Figures

CERAMIC CHIP CARRIER

BACKGROUND OF THE INVENTION

1. Field of the Invention

This invention relates to a process for accurately positioning lead frames onto a ceramic chip carrier to permit wire bonding to the lead frame by means of automatic wire bonding machinery.

2. Description of the Prior Art

In the formation of ceramic chip carriers, lead frames are normally bonded to the ceramic substrate with subsequent connection being made to the leads of the lead frame from appropriate pads in the semiconductor chips secured to the ceramic substrate. These connections from the pads on the chip to the leads of the lead frame are made manually or by means of automatic wire bonding machinery or by mass-bonding techniques using "spider" tape. The automatic wire bonding machinery is normally computer operated on an x-y coordinate basis and it is therefore necessary that the leads of the lead frame be accurately positioned on the substrate so that wiring, which is run from pads on the semiconductor chip to the appropriate lead to the lead frame, is in fact bonded to the appropriate lead of the lead frame.

In accordance with some of the prior art, the entire lead frame was bonded to the ceramic substrate by well known methods and the portions of the leads closely adjacent to the semiconductor device to which wire bonding was to take place would move relative to the semiconductor pads during the process of bonding the lead frame to the ceramic substrate. In the prior art methods, the portion of the lead frame adjacent the chip would be easily distorted in the manufacturing process and lose orientation during bonding to the substrate. It is therefore readily apparent that automatic wire bonding machines can not be used with these types of prior art combination of substrate and lead frame because bonding from appropriate pads of the semiconductor device to the appropriate lead of the lead frame cannot be definitely predicted. It is therefore necessary that a lead frame be bonded to a ceramic substrate wherein the leads of the lead frame are accurately positioned on the substrate and maintain their position during and after the procedure of bonding the lead frame to the substrate.

SUMMARY OF THE INVENTION

In accordance with the present invention, a semiconductor chip carrier is provided with lead frames wherein the ends of each of the inner lead portions, which are closely adjacent the semiconductor device to which the leads are to be bonded, are manufactured with the inner leads temporarily connected to a common supporting rim which must be removed after the attachment of the lead frame to the ceramic substrate is completed. This provides accurate contact spacing between the leads of the lead frame during the bonding of the lead frame to the ceramic substrate. The rim is removed from the lead frame after bonding of the lead frame to the ceramic substrate. This is accomplished by reducing the thickness of rim and a portion of the leads of the lead frame contacting and closely adjacent the rim. This provides a space between the rim and the substrate prior to bonding of the lead frame to the substrate. In this way the rim and a small portion of the leads do not bond to the substrate, thereby allowing the rim to be later removed quite easily. After firing and attachment of the lead frame to the substrate, the temporary supporting rim is removed by pinch cutting, etching or the like.

DESCRIPTION OF THE PREFERRED EMBODIMENT

Figure 1:
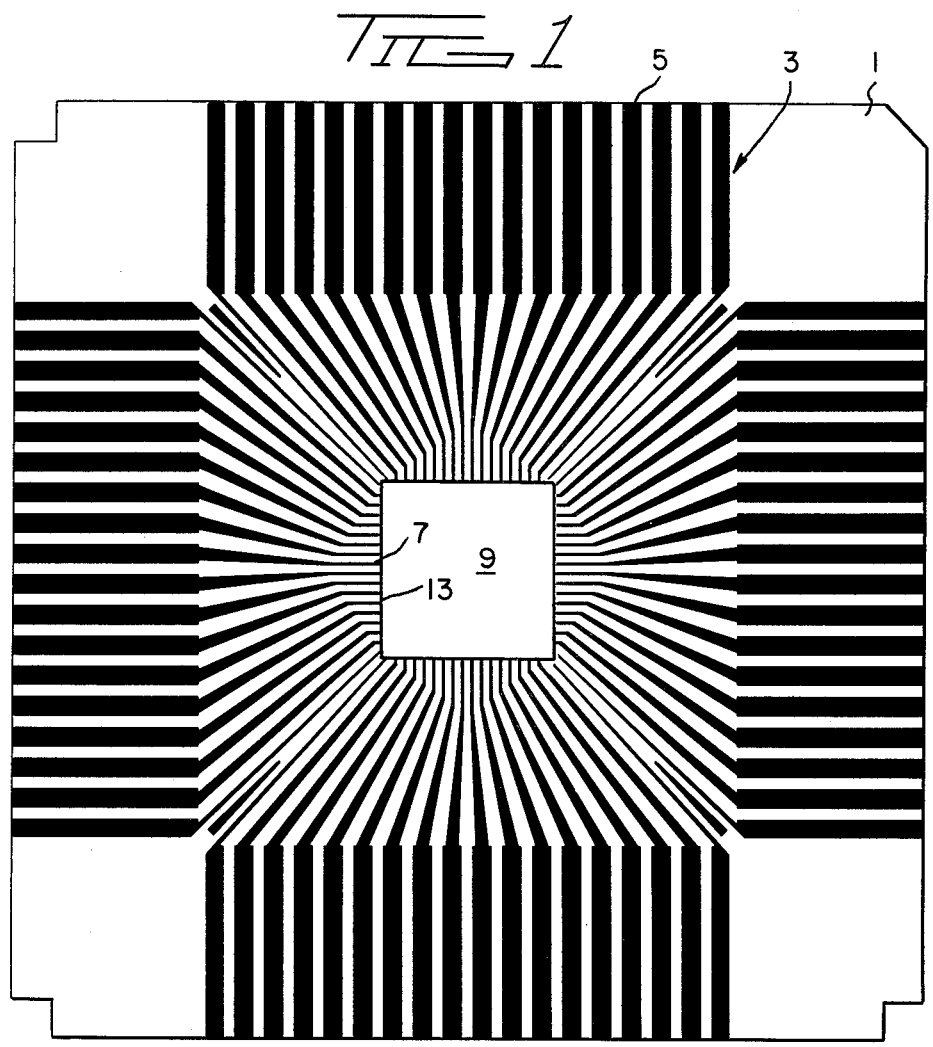
FIG. 1 is a top view of a semiconductor chip carrier including ceramic substrate having a lead frame bonded thereto, the lead frame having a rim at the internal regions thereof.

Referring first to FIG. 1, there is shown a ceramic substrate 1 which is formed of alumina, beryllia, other ceramic or other appropriate materials. Positioned on the substrate 1 is a lead frame 3 composed of a plurality of leads having regions 5 which travel to the edge of the substrate 1 and which has narrow regions 7 to which bonding will take place with wires which are also bonded to semiconductor chips which are placed in the interior region 9 and bonded to the substrate 1 in known manner. The lead frame 3 is preferably formed of copper or copper surfaced metal and is bonded to the ceramic substrate 1 by the procedure set forth in the patents of Burgess et al (U.S. Pat. No. 3,744,120), Babcock et al (U.S. Pat. No. 3,766,634), Burgess et al (U.S. Pat. No. 3,854,892), Burgess et al (U.S. Pat. No. 3,911,553), Cusano et al (U.S. Pat. No. 3,994,430) and Cusano et al (U.S. Pat. No. 4,129,243).

Figure 2:
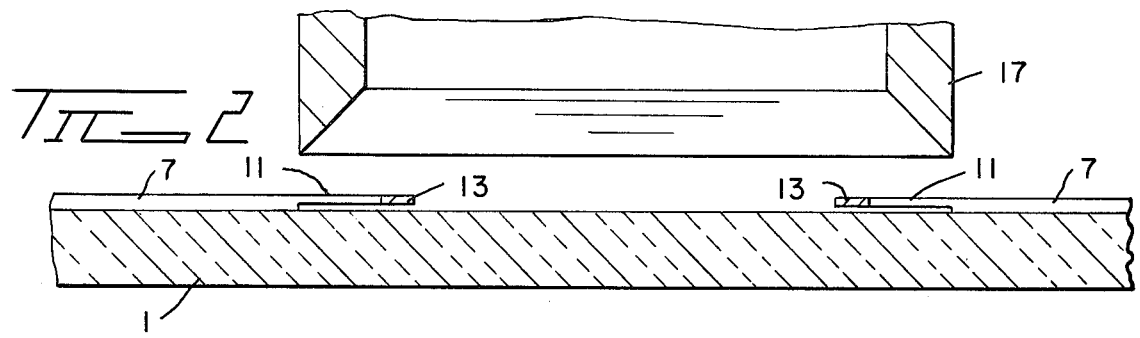
FIG. 2 is a cross-section of the chip carrier of FIG. 1 with cutting element positioned thereabove.

In order to accurately position the thin tips of the leads 7 on the substrate 1 so that automatic wire bonding techniques can accurately be used for bonding wires from the semiconductor pads (not shown) to the leads 7, the interior tips of the leads are positioned above the substrate by reducing their thickness so that they are not in contact with the substrate during the procedure of bonding the lead frame 5 to the substrate 1. This reduced thickness configuration is shown as 11 in FIG. 2 where it can be seen that the tip 11 of the lead 7 is not in contact with the substrate 1. In order to prevent movement of the leads 7 during the bonding procedure, a rim 13 is provided which is secured to all of the tips 11 of the leads 7 and is also of reduced thickness as shown in FIG. 2.

After firing takes place whereby the lead frame 3 bonds to the substrate 1 in accordance with the procedure set forth in the above noted patents, the leads 7 will bond to the substrate 1 in exactly the locations at which they were originally placed. The lead portions at the edges 11 including the rim portion 13 will be raised above the substrate 1 as shown in FIG. 2 and will not have bonded thereto since they will have been raised before and during the bonding procedure. At this point, the rim portion 13 will be removed by means of pinch cutting, etching or the like, such cutting element 17 being shown in FIG. 2 which will remove the rim portion.

Figure 3:
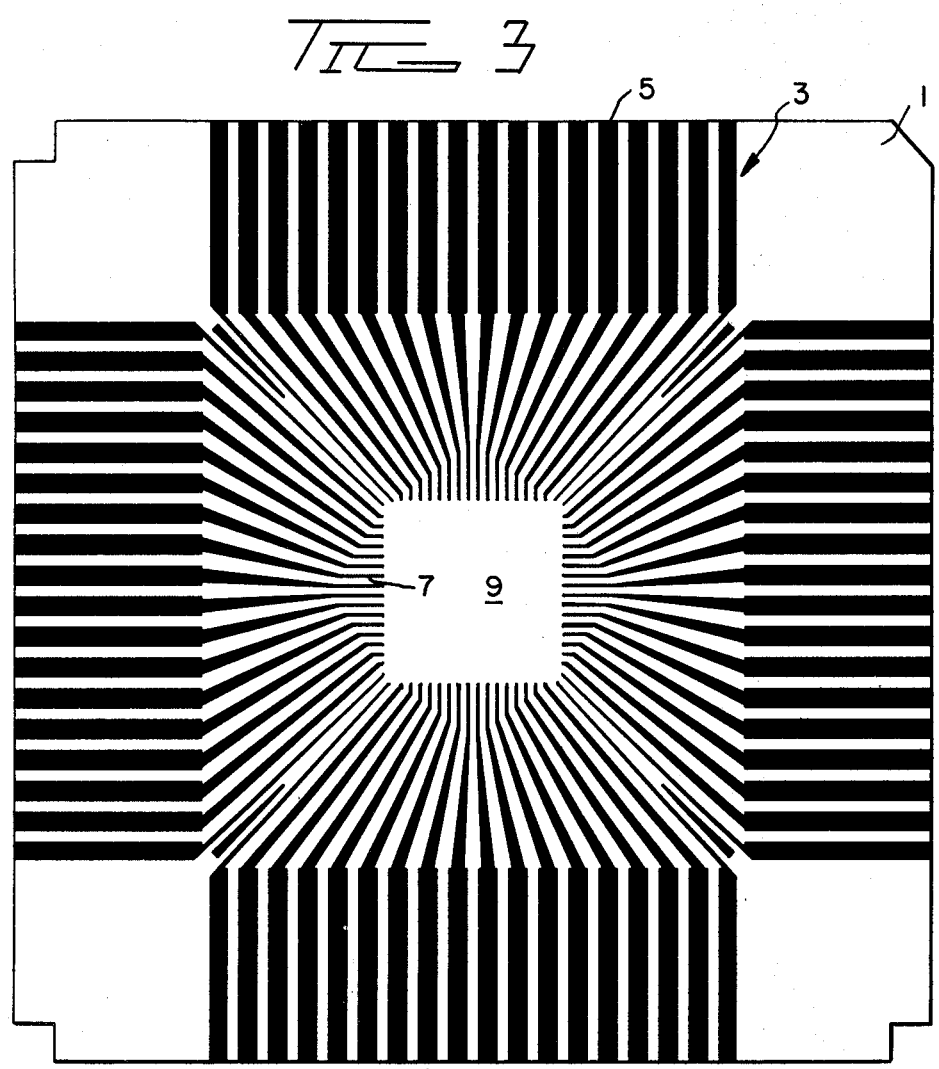
FIG. 3 is a view of the chip carrier of FIG. 1 after the rim has been removed.
Figure 4:
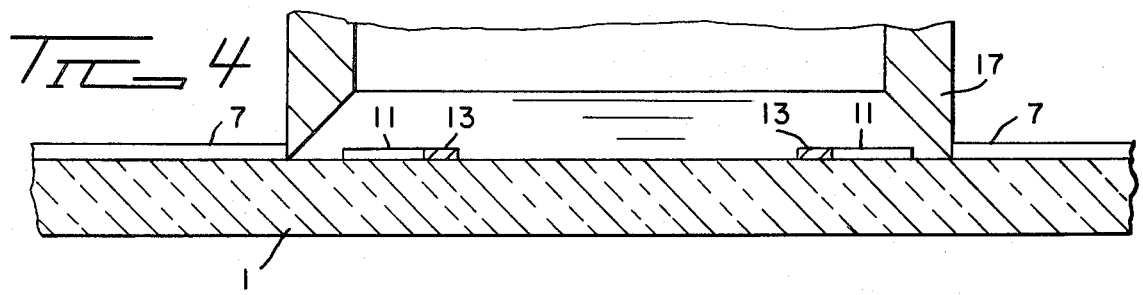
FIG. 4 is a cross-section of the chip carrier of FIG. 3 with a cutting element positioned thereon.

Referring now to FIG. 3, there is shown the chip carrier after the rim has been removed. It can be seen that the edges of all of the leads 7 are properly positioned and available for bonding of wires thereto by automatic wire bonding machinery. FIG. 4 shows a cross-section through FIG. 3 after the rim has been removed.

It can be seen that there has been provided a method and structure wherein the lead frame can be positioned on ceramic substrates with the lead frame retaining its position relative to the substrate without movement during the bonding operation.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A ceramic chip carrier which comprises:
   (a) a ceramic substrate,
   (b) a lead frame bonded directly to said ceramic substrate, said lead frame having a copper surface and including a plurality of leads extending from the edge of said substrate toward a center region of said substrate, and
   (c) a rim connecting together the ends of said leads extending toward the center of said substrate, said rim being coplanar with said lead frame and being disposed in non-contacting relation with said substrate, said rim having a thickness which is less than the thickness of said lead frame.

2. A carrier as set forth in claim 1 wherein said ceramic is taken from the class consisting of alumina and beryllia.

3. A method of forming a ceramic chip carrier comprising the steps of
   (a) providing a ceramic substrate,
   (b) providing a planar copper surfaced lead frame having a plurality of leads and a rim coplanar with said lead frame connecting together the interior of each of said leads, the rim being of a thickness less than said lead frame,
   (c) bonding only the lead frame directly to the substrate, and
   (d) removing said rim from said lead frame.

4. A method as set forth in claim 3 wherein said step (d) includes mechanical removal.

* * * * *